US009284448B2

(12) United States Patent  
Lu

(10) Patent No.: US 9,284,448 B2  
(45) Date of Patent: Mar. 15, 2016

(54) MOLDED REFLECTORS FOR LIGHT-EMITTING DIODE ASSEMBLIES

(75) Inventor: Bing Lu, Union, KY (US)

(73) Assignee: Ticona LLC, Florence, KY (US)

( * ) Notice: Subject to any disclaimer, the term of this patent is extended or adjusted under 35 U.S.C. 154(b) by 356 days.

(21) Appl. No.: 13/086,763

(22) Filed: Apr. 14, 2011

(65) Prior Publication Data
US 2012/0262927 A1 Oct. 18, 2012

(51) Int. Cl.
C08L 27/18 (2006.01)
C08L 67/02 (2006.01)
C08K 3/00 (2006.01)
C08L 23/08 (2006.01)
C08L 25/14 (2006.01)
C08L 63/00 (2006.01)
C08L 71/10 (2006.01)

(52) U.S. Cl.
CPC .............. C08L 67/02 (2013.01); C08K 3/0033 (2013.01); C08L 23/0884 (2013.01); C08L 25/14 (2013.01); C08L 27/18 (2013.01); C08L 63/00 (2013.01); C08L 71/10 (2013.01)

(58) Field of Classification Search
CPC ....................................... C08L 67/02
USPC ......................................... 523/458
See application file for complete search history.

(56) References Cited

U.S. PATENT DOCUMENTS

| | | | |
|---|---|---|---|
| 4,111,892 A | 9/1978 | Kamada et al. | |
| 4,608,623 A | 8/1986 | Stephano | |
| 4,753,890 A | 6/1988 | Smith-Lewis et al. | |
| 4,753,980 A | 6/1988 | Deyrup | |
| 4,859,732 A | 8/1989 | Minnick | |
| 4,990,549 A * | 2/1991 | Delvin et al. | 523/209 |
| 4,999,055 A | 3/1991 | Holtzen et al. | |
| 5,015,942 A | 5/1991 | Kolanko | |
| 5,207,967 A | 5/1993 | Small, Jr. et al. | |
| 5,256,787 A | 10/1993 | Borzatta et al. | |
| 5,428,086 A | 6/1995 | Minnick et al. | |
| 5,596,049 A | 1/1997 | Gallucci et al. | |
| 5,707,437 A | 1/1998 | Niedenzu et al. | |
| 5,965,261 A | 10/1999 | Webster | |
| 6,063,874 A * | 5/2000 | Jin et al. | 525/390 |
| 6,093,765 A | 7/2000 | Cottis | |
| 6,197,873 B1 | 3/2001 | Miyata et al. | |
| 6,236,061 B1 | 5/2001 | Walpita | |
| 6,707,437 B1 | 3/2004 | Kuno | |
| 6,878,972 B2 | 4/2005 | Waalib-Singh et al. | |
| 7,381,996 B2 | 6/2008 | Hsin Chen | |
| 7,709,568 B2 | 5/2010 | Bersted et al. | |
| 7,999,280 B2 | 8/2011 | Kim et al. | |
| 8,007,885 B2 | 8/2011 | Topoulos | |
| 8,070,316 B2 | 12/2011 | Urano et al. | |
| 8,288,793 B2 | 10/2012 | Kim et al. | |
| 8,480,254 B2 | 7/2013 | Lu | |
| 8,545,718 B2 | 10/2013 | Nakayama et al. | |

| | | | |
|---|---|---|---|
| 2003/0065106 A1 | 4/2003 | Ambrose | |
| 2003/0096122 A1 | 5/2003 | Mercx et al. | |
| 2003/0109629 A1 | 6/2003 | Pierre et al. | |
| 2003/0178221 A1 | 9/2003 | Chiu et al. | |
| 2004/0156213 A1 | 8/2004 | Lodhie | |
| 2005/0007772 A1 | 1/2005 | Yen | |
| 2005/0043483 A1* | 2/2005 | Kim et al. | 525/64 |
| 2005/0085589 A1* | 4/2005 | Kim | 525/67 |
| 2005/0118393 A1 | 6/2005 | Corcoran et al. | |
| 2005/0176835 A1 | 8/2005 | Kobayashi et al. | |
| 2006/0230553 A1 | 10/2006 | Thullen et al. | |
| 2007/0093588 A1* | 4/2007 | Takahashi et al. | 524/445 |
| 2007/0155913 A1 | 7/2007 | Chakravarti et al. | |
| 2007/0213458 A1 | 9/2007 | Topoulos | |
| 2007/0275242 A1* | 11/2007 | Gopal et al. | 428/401 |
| 2009/0014505 A1 | 1/2009 | Cretegny et al. | |
| 2009/0130451 A1* | 5/2009 | Farrell | 428/411.1 |
| 2009/0141505 A1 | 6/2009 | Ushiki et al. | |
| 2009/0277858 A1* | 11/2009 | Mitadera et al. | 215/12.1 |
| 2010/0032702 A1 | 2/2010 | Lahijani | |
| 2010/0200882 A1 | 8/2010 | Kotani et al. | |
| 2010/0309571 A1 | 12/2010 | Watari et al. | |
| 2011/0310622 A1 | 12/2011 | Topoulos | |
| 2012/0097894 A1 | 4/2012 | Nakayama et al. | |
| 2012/0264868 A1 | 10/2012 | Lu | |

(Continued)

FOREIGN PATENT DOCUMENTS

| | | |
|---|---|---|
| CN | 101565538 A | 10/2009 |
| EP | 0273149 | 6/1988 |
| EP | 0485240 A1 | 5/1992 |
| EP | 0 684 648 A2 | 11/1995 |
| EP | 1798268 | 6/2007 |
| JP | 55027355 (A) | 2/1980 |
| JP | 03-084060 | 4/1991 |
| JP | 03084060 | 9/1991 |
| JP | 04-142362 | 5/1992 |

(Continued)

OTHER PUBLICATIONS

Topoulous, U.S. Appl. No. 13/692,419, filed Dec. 3, 2012, Light Emitting Diode Assembly Housing Comprising Poly (Cyclohexanedimethanol Terephthalate).

(Continued)

Primary Examiner — Megan McCulley

(74) Attorney, Agent, or Firm — Dority & Manning, P.A.

(57) ABSTRACT

Polymer compositions are described containing a poly(1,4-cyclohexanedimethanol terephthalate) polymer in combination with a white pigment and optionally one or more reinforcing fillers. In accordance with the present disclosure, the composition also contains one or more reactive viscosity stabilizers. In order to prevent against yellowing, the composition is free of various aromatic epoxy resins, such as novolac epoxy resins. The polymer composition has excellent reflectance properties making the composition well suited for producing reflectors for light sources, such as LED assemblies.

21 Claims, 2 Drawing Sheets

(56) References Cited

U.S. PATENT DOCUMENTS

| | | | |
|---|---|---|---|
| 2013/0158184 A1 | 6/2013 | Topoulos | |
| 2014/0167088 A1* | 6/2014 | Lu | 257/98 |
| 2014/0299907 A1* | 10/2014 | Lu | 257/98 |

FOREIGN PATENT DOCUMENTS

| | | | |
|---|---|---|---|
| JP | H06151977 | | 5/1994 |
| JP | 11087780 A | | 3/1999 |
| JP | 2002302596 A | | 10/2002 |
| JP | 2003124521 A | | 4/2003 |
| JP | 2003262701 A | | 9/2003 |
| JP | 2005038661 (A) | | 2/2005 |
| WO | WO 02/052615 A2 | | 7/2002 |
| WO | WO 03/085029 A1 | | 10/2003 |
| WO | WO 2008/002362 A1 | | 1/2008 |
| WO | WO 2010000838 | * | 1/2010 |
| WO | WO 2010/049531 A1 | | 5/2010 |
| WO | WO 2011/040138 A1 | | 7/2011 |
| WO | WO 2012/141967 A1 | | 10/2012 |
| WO | WO 2013/101277 A1 | | 4/2013 |

OTHER PUBLICATIONS

Lu, U.S. Appl. No. 13/086,805, filed Apr. 14, 2011, Reflectors for Light-Emitting Diode Assemblies Containing a White Pigment.

Citation of Related Applications.

DuPont Ti-Pure®; "Titanium Dioxide for Coatings"; Jun. 2007; pp. 1-28.

IARC Working Group on the Evaluation of Carcinogenic Risks to Humans: "Titanium Dioxide" in IARC Monographs on the Evaluation of Carcinogenic Risks to Humans, Carbon Black, Titanium Dioxide and Talc. IARC Monographs, vol. 93, 2010; pp. 193-214.

International Search Report for Application No. PCT/US2012/032041, dated Oct. 8, 2012.

International Search Report for Application No. PCT/US2012/032262, dated Jun. 26, 2012.

International Search Report for Application No. PCT/US2012/032267, dated Jun. 26, 2012.

Temple C. Patton, "Pigment Handbook, vol. II, Applications and Markets"; John Wiley & Sons; dated 1973.

* cited by examiner

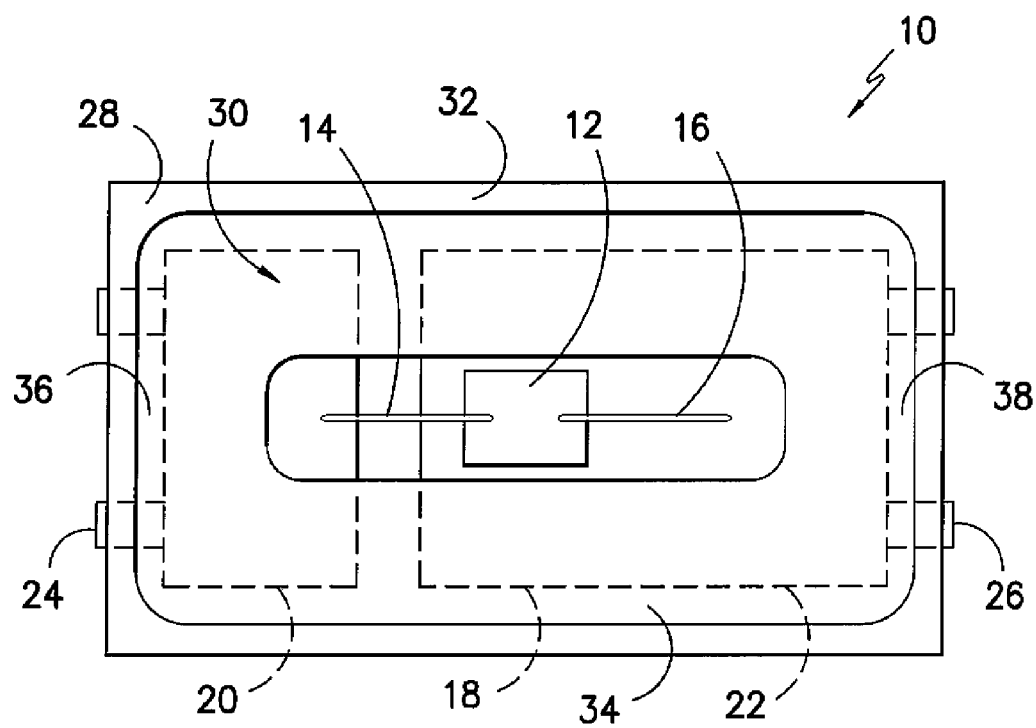
FIG. -1-
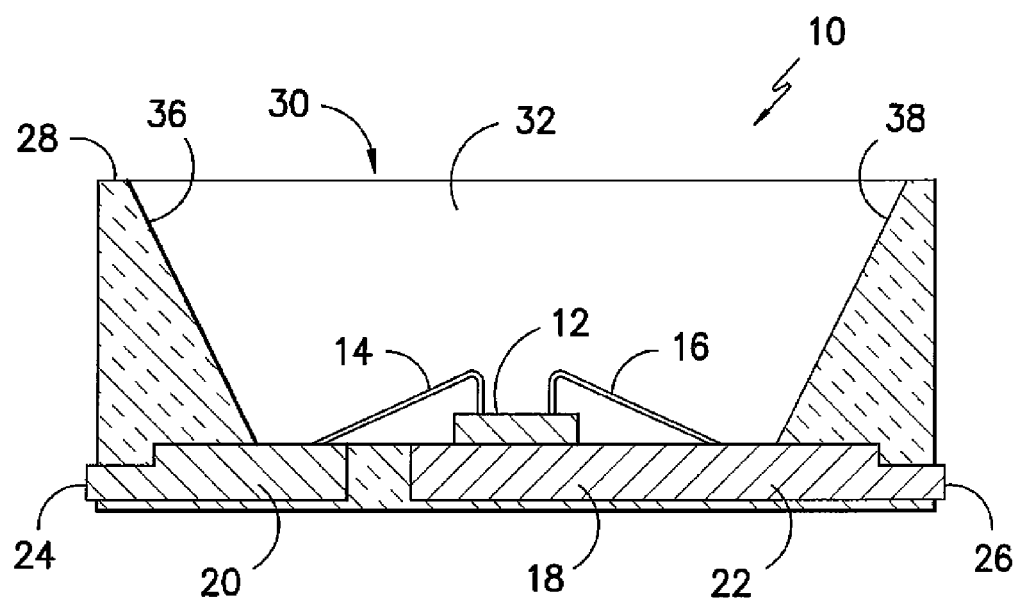
FIG. -2-

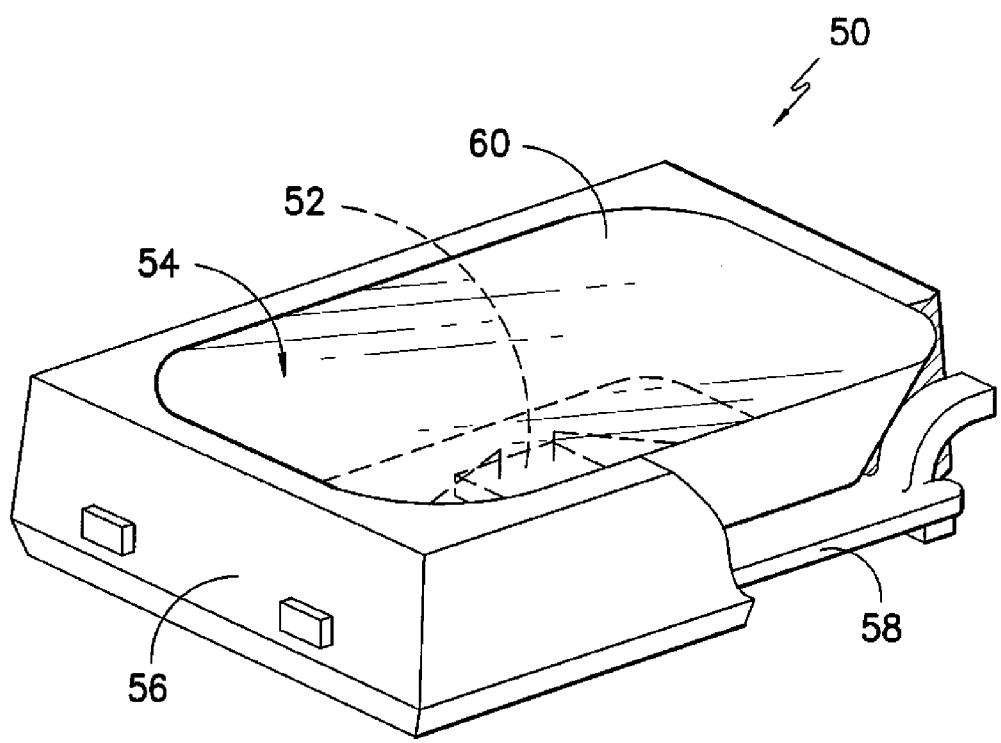
FIG. -3-
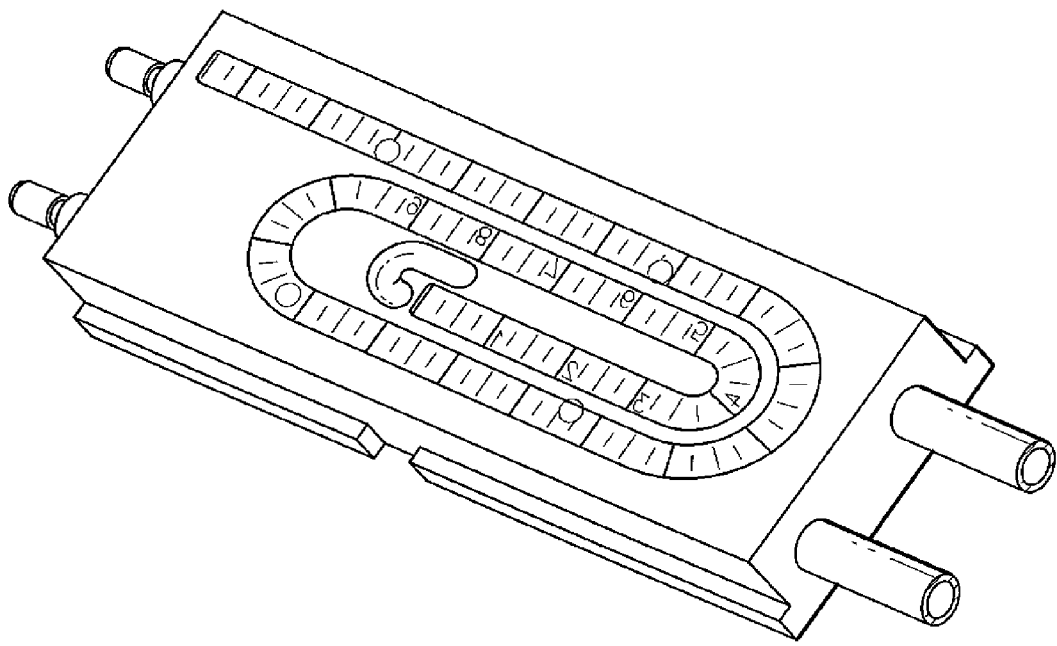
FIG. -4-

MOLDED REFLECTORS FOR LIGHT-EMITTING DIODE ASSEMBLIES

BACKGROUND

Light-emitting diodes, commonly called LEDs, continue to increase in popularity as a light source for use in many and diverse applications. The demand for LEDs has grown rapidly, especially in the last five years. LEDs are being used as light sources in numerous applications due to their many advantages over conventional light sources. LEDs generally consume significantly less power than incandescent and other light sources, require a low voltage to operate, are resistant to mechanical shock, require low maintenance, and generate minimal heat when operating. As a result, LEDs are displacing incandescent and other light sources in many uses and have found applications, for instance, as traffic signals, large area displays, interior and exterior lighting, cellular telephone displays, digital clock displays, displays for consumer appliances, flashlights, and the like.

LEDs generally include a light-emitting diode mounted on a substrate that is electrically connected to a lead frame. The lead frame typically includes two terminals for connecting the LED to a power source. The light-emitting diode is a semiconductor device fabricated similar to the manner in which integrated circuits are produced. For instance, the light-emitting diode can be made from several layers of material that are sequentially deposited on a semiconductor substrate. The light-emitting diode within the semiconductor material includes an n-type material separated from a p-type material by an active layer. When a voltage is applied to the diode, positive charges or "holes" from the p-type material move towards the active layer while the negative charges or electrons from the n-type material also move towards the active layer in an opposite direction which produces light. In particular, the moving electrons release energy in the form of photons. Thus, one significant advantage of LEDs is that the devices produce light without a filament that will burn out over time. Thus, LEDs last a relatively long time, can be made to be very compact, and are very durable. Further, since a filament is not heated in order to produce light, LEDs are also very energy efficient.

After a light-emitting diode is fabricated, the semiconductor chip can be mounted adjacent to a reflector and connected to a lead frame. The lead frame can include an anode terminal and a cathode terminal for applying power to the assembly. In certain embodiments, the LED element located within the reflector can be sealed by a translucent or transparent resin. The transparent or translucent resin may serve as a lens for further enhancing the light that is emitted.

The reflector for the LED can also serve as the housing for the LED and is typically made from a molded polymeric resin. For example, the polymeric resin can be injection molded to form the housing and reflector. In one embodiment, the polymeric resin is injection molded over a lead frame for integrating the lead frame into the LED assembly.

The molded polymer resin used to form the reflector preferably possesses a particular combination of characteristics and properties. For instance, the polymer resin should be well suited to reflecting light at the wavelength at which the LED operates. Many LEDs, for instance, are designed to emit a white light. Thus, the polymer resin used to form the reflector should reflect a significant amount of light in the visible light region and particularly should reflect a significant percentage of light in the blue light wavelength range. Reflecting light in the blue wavelength range, for instance, has been found to significantly enhance the brightness of the LED, since LEDs that emit a white light emit a significant amount of light in the blue wavelength range. Increasing the reflectance of the reflector as high as possible minimizes loss of light when the LED is being operated.

The polymer resin used to form the reflector should also possess a high whiteness index. The whiteness index of the reflector indicates how well the reflector can reflect light over the entire visible light wavelength range (from about 400 nm to about 700 nm). In general, the higher the whiteness index of the material, the higher the reflectance of the material. A material possessing a white index value of 100, for instance, is considered a substantially perfect reflecting diffuser.

In addition to having excellent reflectance properties, the polymer resin used to form the reflector should also have good melt flow properties during injection molding of the parts. For instance, many LED structures are relatively small having dimensions that at times can be less than 1 millimeter. Reflectors can also have relatively complex shapes depending upon the particular application and the geometries of the lead plate in the LED. Thus, when the polymer resin is heated, the polymer should have sufficient flow properties in order to uniformly and repeatedly fill the interstices of the mold. The polymer resin should also have a stable viscosity that does not fluctuate during processing.

In addition to the above, the polymer resin used to form the reflector should have sufficient heat resistance including long term aging stability when either being soldered onto an adjacent part or when exposed to the operating temperatures of the LED. Many LED assemblies, for instance, are attached to circuit boards and other substrates using reflow oven welding processes that operate at temperatures up to about 260° C. The polymer resin should have good heat resistance properties to the reflow process and should not blister or otherwise deteriorate when subjected to the welding conditions.

During use, the LED also generates heat which is absorbed by the reflector. In the past few years, the amount of heat generated by the LED has increased as the LED element power has increased. When subjected to heat during welding and/or heat during use, the reflectance properties of the polymer resin should not deteriorate. In the past, for instance, exposure to high temperatures and/or repeated heating and cooling during use have caused polymer resins to yellow. Yellowing causes the whiteness index of the resin to lower. Yellowing is especially a problem for LEDs that emit blue light since yellow surfaces have a tendency to absorb light in the blue wavelength range.

In addition to the above, the reflector is generally a thin small part and requires satisfactory mechanical strength. Thus, reflectors should also have sufficient impact strength to avoid breakage during assembly of the LED and during use of the LED.

In U.S. Patent Publication No. 2007/0213458 entitled "Light-Emitting Diode Assembly Housing Comprising Poly (cyclohexanedimethanol terephthalate) Compositions", a reflector for an LED is disclosed that is made from a poly (cyclohexanedimethanol terephthalate) (hereinafter "PCT") composition. The '458 application, which is incorporated herein by reference, has made great advances in design and function of LEDs. The present disclosure, however, is directed to further improvements. In particular, the present disclosure is generally directed to a reflector for an LED made from a PCT polymer composition that has improved viscosity characteristics and/or reflectance characteristics, including better resistance to yellowing after thermal aging.

SUMMARY

In general, the present disclosure is directed to a molded reflector for a light source, such as a light-emitting diode. The present disclosure is also directed to a polymer composition for producing the reflector.

As will be described in greater detail below, the polymer composition of the present disclosure is formulated so as to have a combination of good melt flow properties during injection molding and high reflectance properties. In addition, the reflectance properties of the polymer composition are resistant to thermal aging and yellowing over time.

In one embodiment, for instance, the present disclosure is directed to a molded reflector surrounding a light-emitting source. The reflector is molded from a polymeric material. The polymeric material is comprised of poly(1,4-cyclohexanedimethanol terephthalate), a white pigment, and at least one reactive viscosity stabilizer. In accordance with the present disclosure, a reactive viscosity stabilizer is selected that not only stabilizes the viscosity of the polymeric material during injection molding conditions but also does so without later causing yellowing. In this regard, the reactive viscosity stabilizer comprises a phenoxy resin or a non-aromatic epoxy resin. To prevent against yellowing, the polymeric material is also free of any epoxy novolac resins.

In accordance with the present disclosure, the polymeric material used to form the molded reflector can have an initial reflectance at 460 nm of greater than about 90%, such as greater than about 93%, such as greater than about 95%. The initial reflectance at 460 nm is generally less than 100%. The polymeric material can also have an initial whiteness index of greater than about 86, such as greater than about 92, such as greater than about 95. The initial whiteness index is generally less than 103, such as less than about 100. Of particular advantage, the polymeric material can have a whiteness index after aging at 200° C. for four hours of still greater than about 50, such as greater than about 60, such as greater than about 62, such as greater than about 65, such as greater than about 68, such as even greater than about 70. In general, the whiteness index after aging at 200° C. is less than the initial whiteness index of the material and is generally less than about 95, such as less than about 85.

In addition to a PCT resin, a white pigment and at least one reactive viscosity stabilizer, the polymeric material can also contain various other ingredients and components in various amounts. In one embodiment, for instance, the polymeric material can further contain an inorganic filler. In one particular embodiment, the polymeric material contains from about 20% to about 60% by weight of the PCT polymer, from about 1% to about 40% by weight of the inorganic filler, from about 15% to about 50% by weight of the white pigment and from about 0.2% to about 8% by weight of the one or more reactive viscosity stabilizers.

In addition to the above, the polymeric material, in certain embodiments, can further contain one or more other thermoplastic polymers. Other thermoplastic polymers that may be present in the polymeric material include a polybutylene terephthalate, a liquid crystal polymer, or mixtures thereof. The one or more thermoplastic polymers can be present in the polymeric material in an amount from about 1% to about 15% by weight.

In one embodiment, the polymeric material can further contain a polytetrafluoroethylene polymer. The polytetrafluoroethylene polymer can be present in the polymeric material in an amount from about 0.5% to about 10% by weight.

The polymeric material may also include one or more impact modifiers. The impact modifiers may be reactive or non-reactive. For instance, in one embodiment, the polymeric material contains a terpolymer of ethylene, methyl acrylate and glycidyl(meth)acrylate.

In another embodiment, the polymeric material contains an ethylene-(methyl)acrylate copolymer. In still another embodiment, the polymeric material may include a combination of the terpolymer of ethylene, methyl acrylate and glycidyl(meth)acrylate and an ethylene-(methyl)acrylate copolymer.

As described above, the polymeric material contains a reactive viscosity stabilizer that, in one embodiment, may comprise a phenoxy resin. In an alternative embodiment, the reactive viscosity stabilizer may comprise an alicyclic epoxy resin.

The polymeric material used to form the molded reflector not only has good melt flow properties but also is resistant to yellowing. In one embodiment, the polymeric material can exhibit a spiral flow of greater than about five inches as will be described below.

BRIEF DESCRIPTION OF THE DRAWINGS

A full and enabling disclosure of the present invention, including the best mode thereof to one skilled in the art, is set forth more particularly in the remainder of the specification, including reference to the accompanying figures, in which:

FIG. 1 is a perspective view of one embodiment of an LED assembly made in accordance with the present disclosure;

FIG. 2 is a plan view of the LED assembly illustrated in FIG. 1;

FIG. 3 is a perspective view of another embodiment of an LED assembly made in accordance with the present disclosure; and FIG. 4 is a perspective view of one-half of a mold used for measuring spiral flow length.

Repeat use of reference characters in the present specification and drawings is intended to represent the same or analogous features or elements of the present invention.

DETAILED DESCRIPTION

It is to be understood by one of ordinary skill in the art that the present discussion is a description of exemplary embodiments only, and is not intended as limiting the broader aspects of the present disclosure.

The present disclosure is generally directed to a light-emitting diode assembly and to a reflector for a light-emitting diode. The present disclosure is also directed to a polymer composition that is well suited for use in producing light-emitting diode assemblies.

The polymer composition of the present disclosure generally contains a poly(1,4-cyclohexanedimethanol terephthalate) polymer in combination with a white pigment. Optionally the composition can also contain a reinforcing agent, such as a filler or reinforcing fibers. In accordance with the present disclosure, the composition further contains one or more reactive viscosity stabilizers. The reactive viscosity stabilizers assist in maintaining an optimum viscosity of the composition during melt flow applications, such as during injection molding. In particular, the one or more reactive viscosity stabilizers inhibit the viscosity of the composition from unfavorably fluctuating during melt processing. Of particular advantage, the present inventors discovered that the particular melt viscosity stabilizers of the present disclosure also do not cause unwanted yellowing of the composition during later use, especially when the composition is used as a reflector for a light source. In this regard, the composition may also be formulated so as to exclude additives and stabilizers that may cause yellowing to occur. In this regard, in one embodiment, the composition is free from some or all of any aromatic epoxy resins, and is especially free of a novolac epoxy resin.

The polymer composition of the present disclosure can be formulated so as to have excellent melt flow properties in combination with excellent light reflective properties. With respect to the melt flow properties, for instance, in one embodiment, the polymer composition can have a spiral flow length of at least five inches, such as at least six inches, such as even at least seven inches. In general, the spiral flow length is less than about fifteen inches, such as less than about twelve inches. As used herein, the spiral flow length is determined at a temperature of 305° C. and at a mold temperature of 120° C. Spiral flow length is measured by injecting the polymer composition into a mold as shown in FIG. 4. The mold is 1/32 inches thick and 1/2 inches wide. The polymer composition is injected into the mold using a 32 mm extruder at an injection speed of 4 inches per second and a shot size of 1.8 inches. Spiral flow length generally indicates the flow characteristics of the polymer composition when being melt processed. Higher spiral flow lengths indicate the ability of the material to uniformly and evenly flow into a mold, which also indicates the ability of the material to fill any interstices of the mold that may exist. For example, a higher spiral flow length is particularly preferred when molding small parts that may have complex three-dimensional configurations, such as reflectors and housings for LED assemblies.

In addition to having a relatively high spiral flow length, polymer compositions made according to the present disclosure can also be formulated so as to have a stable viscosity. In particular, one or more reactive viscosity stabilizers can be incorporated into the formulation in an amount sufficient for the melt viscosity of the composition during processing to not fluctuate by more than about 5%, such as no more than about 3%.

The polymer composition of the present disclosure also has a relatively high initial reflectance, and excellent reflectance stability. For instance, once molded into an article, the polymer material of the present disclosure can have an initial reflectance at 460 nm of greater than about 90%, such as greater than about 93%, such as greater than about 95%. Reflectance is measured according to ASTM Test Method 1331 using a spectracolormeter. During testing, a CIE D65 daylight illuminant is used at an angle of 10°.

In addition to initial reflectance, polymer articles made according to the present disclosure can also have a relatively high initial whiteness index. Whiteness index can be measured according to WI E313. Articles made according to the present disclosure can have an initial whiteness index of greater than about 80, such as greater than about 90, such as greater than about 92, such as greater than about 95.

Of particular advantage, articles made according to the present disclosure also have great reflectance stability properties. For instance, after aging at 200° C. for four hours, the whiteness index of articles made according to the present disclosure can be at least about 70, such as at least about 72, such as at least about 74, such as even greater than about 75. The whiteness index after aging is lower than the initial whiteness index.

In addition to the above properties, the polymer composition of the present disclosure also has good reflow resistance properties at relatively high temperatures, such as at temperatures around 260° C. The polymer material has good silicone adhesion properties, which may be important in applications where an adhesive is used to either attach components in the LED assembly to the reflector or to attach the reflector to a substrate. Articles made according to the present disclosure also have good mechanical properties, such as good impact resistance. The material of the present disclosure also displays low moisture absorption.

Referring to FIGS. 1 and 2, one embodiment of an LED assembly 10 that may be made in accordance with the present disclosure is shown. In the embodiment illustrated in FIGS. 1 and 2, the LED assembly 10 is considered a side view LED. As shown, the LED assembly 10 includes a light-emitting diode 12 that is configured to emit light when a current is fed through the device. The light-emitting diode 12, for instance, may be comprised of a semiconductor chip including multiple layers of materials. The LED 12 generally includes an n-type material layer and a p-type material layer, which form a p-n junction that can be connected to a voltage source. In one embodiment, for instance, the p-type layer may comprise doped gallium aluminum arsenide, while the n-type layer may comprise doped gallium arsenide.

The LED 12 is connected to a first bonding wire 14 and to a second bonding wire 16. The bonding wires 14 and 16 are connected to a lead frame 18. The lead frame 18 includes a first lead frame portion 20 and a second lead frame portion 22. The lead frame 18 may include or be connected to an anode 24 and a cathode 26 which may also be considered a first terminal 24 and a second terminal 26.

In accordance with the present disclosure, the LED assembly 10 further includes a reflector 28 which can also serve as the housing for the LED assembly. The reflector 28, in accordance with the present disclosure, is made from a polymer composition having excellent reflectance properties.

As shown in FIGS. 1 and 2, the reflector 28 defines a cavity 30 in which the LED 12 is located. The walls of the cavity 30 generally surround the LED 12 and, in the embodiment illustrated, have a depth sufficient for the LED 12 to be recessed within the cavity.

The cavity 30 of the reflector 28 surrounds the LED 12 and serves to reflect light being emitted by the LED in an outward direction. The cavity 30 may have any suitable shape. For instance, the cavity 30 may be cylindrical, conical, parabolic, or any other suitable curved form. Alternatively, the walls of the cavity 30 may be parallel, substantially parallel, or tapered with respect to the diode 12. In the embodiment illustrated in FIG. 1, for instance, the cavity 30 has a smooth surface and is comprised of side walls 32 and 34 and end walls 36 and 38. The side walls 32 and 34 taper in an outward direction from the LED 12. The end walls 36 and 38, on the other hand, can be substantially parallel or may also taper outwardly from the LED source.

If desired, the cavity 30 of the reflector 28 may be filled with a clear material, such as a transparent material or a translucent material. For instance, the cavity 30 may be filled with an epoxy or a silicone material. In one embodiment, the material used to fill the cavity 30 may act as a lens for the light being emitted by the LED 12.

Referring to FIG. 3, another embodiment of an LED assembly 50 that may be made in accordance with the present disclosure is shown. In the embodiment illustrated in FIG. 3, a top view LED assembly is shown. The top view LED assembly 50 is similar in construction to the side view LED assembly 10 illustrated in FIGS. 1 and 2.

For instance, the top view LED assembly 50 includes an LED 52 that is positioned towards the bottom of a cavity 54 of a reflector 56. The LED 52 is also connected to a lead frame

58. In the embodiment illustrated in FIG. 3, the cavity 54 of the reflector 56 is filled with a clear material 60.

LED assemblies as shown in FIGS. 1-3 generally have relatively small dimensions. For example, the LED assemblies typically have a greatest dimension (such as height, width, depth or diameter) that is generally less than about 10 mm, such as typically less than about 8 mm. The LED assemblies typically include at least one dimension, such as depth, that is less than 5 mm, such as less than 2 mm, such as even less than 1 mm. As will be described below, the polymer composition of the present disclosure is capable of forming reflectors for LED assemblies using melt flow processing techniques. For instance, in one embodiment, the polymer composition of the present disclosure is blow molded in forming the reflectors. Of particular advantage, the composition of the present disclosure is formulated so as to have melt flow properties capable of forming hundreds of reflectors simultaneously.

As described above, the polymer composition of the present disclosure contains a poly(1,4-cyclohexanedimethanol terephthalate) polymer, which is typically referred to as a "PCT" polymer. Poly(1,4-cyclohexanedimethanol terephthalate) is a polyester that contains repeat units from a dicarboxylic acid component and a glycol component. At least about 80 mol percent, more preferably at least about 90 mol percent, and especially preferably all of the diol repeat units are derived from 1,4-cyclohexanedimethanol and are of formula (I).

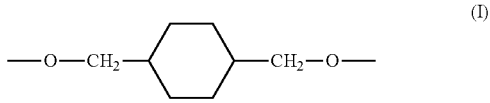

(I)

At least about 80 mol percent, more preferably at least about 90 mol percent, and especially preferably all of the dicarboxylic acid repeat units are derived from terephthalic acid and are of formula (II).

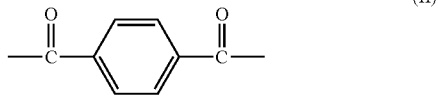

(II)

In one embodiment, the PCT polymer contains 100 mol percent of terephthalic acid or diesters. The glycol component, on the other hand, can contain a total of 100 mol percent 1,4-cyclohexanedimethanol.

In various embodiments, however, the dicarboxylic acid component may contain up to 10 mol percent of other aromatic, aliphatic, or alicyclic dicarboxylic acids such as isophthalic acid, naphthalenedicarboxylic acid, cyclohexanedicarboxylic acid, succinic acid, subacic acid, adipic acid, glutaric acid, azelaic acid, and the like.

The glycol component may also contain up to about 10 mol percent of other aliphatic or alicyclic glycols, such as diethylene glycol, triethylene glycol, ethylene glycol, propanediol, butanediol, pentanediol, hexanediol, and the like.

The PCT polymer can have an inherent viscosity (I.V.) of from about 0.3 to about 1.5 and a melting point of at least 260° C.

In one embodiment, the PCT polymer can comprise a blend of two or more different grades of PCT polymers. For instance, in one embodiment, a blend, such as a 1:1 blend, of high I.V. PCT polymer with a low I.V. PCT polymer may be used. In an alternative embodiment, a blend, such as a 2:1 blend, may be used that includes a PCT polymer wherein the dicarboxylic acid component is 100 mol percent terephthalic acid and a PCT polymer in which the dicarboxylic acid component is 90 mol percent terephthalic acid and 10 mol percent isophthalic acid.

In general, the PCT polymer is present in the composition in an amount of at least about 20% by weight, such as in an amount of at least 30% by weight, such as in an amount of at least 40% by weight, such as in an amount of at least about 50% by weight, such as in an amount of at least about 60% by weight. The PCT polymer is generally present in an amount less than about 80% by weight, such as in an amount less than about 70% by weight. In one embodiment, the PCT polymer is present in an amount from about 20% by weight to about 60% by weight.

In addition to the PCT polymer, the composition also contains at least one white pigment in amounts greater than 10% by weight, such as in amounts of at least about 15% by weight. The white pigment is present in the composition in an amount sufficient to increase the reflectance of articles molded from the composition. White pigments that may be included in the composition include titanium dioxide, zinc oxide, white lead, aluminum oxide, barium sulfate, and the like.

In one embodiment, the white pigment comprises titanium dioxide. The titanium dioxide may be any sort, such as a rutile titanium dioxide. The titanium dioxide particles can have any suitable shape, such as spherical particles or elliptic particles. The titanium dioxide powder can be comprised of particles having a diameter of from about 10 nm to about 20,000 nm, such as from about 150 nm to about 500 nm.

In one embodiment, the titanium dioxide particles can be coated. For example, the titanium dioxide particles can be first coated with an inorganic coating and then optionally with an organic coating that is applied over the inorganic coating. Inorganic coatings that may be used include metal oxides. Organic coatings may include carboxylic acids, polyols, alkanolamines, and/or silicon compounds.

Examples of carboxylic acids suitable for use as an organic coating include adipic acid, terephthalic acid, lauric acid, myristic acid, palmitic acid, stearic acid, polyhydroxystearic acid, oleic acid, salicylic acid, malic acid, and maleic acid. As used herein, the term "carboxylic acid" includes the esters and salts of the carboxylic acids.

Examples of silicon compounds suitable for an organic coating include, but are not limited to, silicates, organic silanes, and organic siloxanes, including organoalkoxysilanes, aminosilanes, epoxysilanes, mercaptosilanes, and polyhydroxysiloxanes. Suitable silanes can have the formula $R_xSi(R')_{4-x}$, wherein R is a nonhydrolyzable aliphatic, cycloaliphatic, or aromatic group having from 1 to about 20 carbon atoms, and R' is one or more hydrolyzable groups such as an alkoxy, halogen, acetoxy, or hydroxy group, and X is 1, 2, or 3.

Useful suitable silanes suitable for an organic coating include one or more of hexyltrimethoxysilane, octyltriethoxysilane, nonyltriethoxysilane, decyltriethoxysilane, dodecyltriethoxysilane, tridecyltriethoxysilane, tetradecyltriethoxysilane, pentadecyltriethoxysilane, hexadecyltriethoxysilane, heptadecyltriethoxysilane, octadecyltriethoxysilane, N-(2-aminoethyl) 3-aminopropylmethyldimethoxysilane, N-(2-aminoethyl) 3-aminopropyltrimethoxysilane, 3-aminopropyltriethoxysilane, 3-glycidoxypropyltrimethoxysilane, 3-glycidoxypropylmethyldimethoxysilane, 3-mercaptopropyltrimethoxysilane and combinations of two or more thereof. In other useful silanes, R has between 8 and 18 carbon atoms and R' is one or more of chloro, methoxy, ethoxy, or hydroxy groups.

One or more white pigments may be present in the composition in an amount of at least about 10% by weight, such as in an amount of at least about 15% by weight, such as in an amount of at least 20% by weight, such as in an amount of at least 25% by weight. The white pigments may be present in the composition generally in an amount less than 60% by weight, such as in an amount less than about 50% by weight.

The polymer composition of the present disclosure can also optionally contain one or more reinforcing agents, such as fillers and fibers. Such materials can include, for instance, glass fibers, wollastonite, potassium titanate, calcium carbonate, talc, mica, silica, kaolin, and the like. Such inorganic fillers may be present in the composition in an amount from about 1% to about 40% by weight, such as in an amount from about 10% to about 30% by weight.

In accordance with the present disclosure, the composition further contains one or more reactive viscosity stabilizers. A reactive viscosity stabilizer comprises a material capable of not only reacting with end groups on the PCT polymer, but also capable of stabilizing the viscosity of the PCT polymer in a manner that prevents the viscosity from fluctuating during melt processing. The reactive viscosity stabilizer can also serve to compatibilize the PCT composition.

In one embodiment, the reactive viscosity stabilizer comprises a material that can react with carboxyl or hydroxyl end groups on the PCT polymer. In this manner, the reactive viscosity stabilizer may act as a chain extender.

Reactive viscosity stabilizers that may be used in accordance with the present disclosure generally include phenoxy resins and/or non-aromatic epoxy resins. In one embodiment, for instance, the reactive viscosity stabilizer comprises a modified phenoxy resin that is capable of reacting with the PCT polymer. The phenoxy resin, for instance, may include hydroxyl functionality. The phenoxy resin, for instance, may have a glass transition temperature of less than about 120° C., such as less than about 110° C., such as less than about 100° C. The phenoxy resin may have a viscosity when tested in cyclohexanone at 25% NV of less than about 2500 cP, such as less than about 2300 cP.

Non-aromatic epoxy resins that may be used as the reactive viscosity stabilizer include 3,4-epoxycyclohexenylmethyl-3', 4'-epoxycyclohexene carboxylate, 1,4-cyclohexane dimethanoldigrycicdyl ether, hydrogenated bis-phenol-A type epoxy resin and/or tris(2,3-epoxypropyl)isocyanurate. In general, any suitable alicyclic epoxy resin may be used.

In addition to the above reactive viscosity stabilizers or instead of the above reactive viscosity stabilizers, the composition may contain an epoxy-functional copolymer as the reactive viscosity stabilizer. Exemplary copolymers having multiple epoxy pendant groups include the reaction products of one or more ethylenically unsaturated monomers (e.g. styrene, ethylene, and the like) with an epoxy-containing ethylenically unsaturated monomer (e.g. glycidyl C1-4 (alkyl)acrylate, ally glycidyl ethacryalte, and glycidyl itoconate). For example, in one embodiment the epoxy-functional copolymer is a styrene-acrylic copolymer (including an oligomer) containing glycidyl groups incorporated as side chains.

The one or more reactive viscosity stabilizers are present in the composition in an amount sufficient to stabilize the viscosity of the composition during melt processing without causing viscosity fluctuations. In general, the reactive viscosity stabilizers are present in the composition in an amount from about 0.2% to about 8% by weight, such as from about 0.5% to about 5% by weight.

Of particular advantage, reactive viscosity stabilizers are used that do not significantly increase yellowing of the composition over time. In this regard, the polymer composition can be formulated so as to be substantially or completely free of various aromatic epoxy resins. In one embodiment, for instance, the composition is free of any epoxy novolac resins, such as an epoxy cresol novolac resin.

The polymer composition of the present disclosure can further contain one or more impact modifiers. The impact modifiers can be reactive with the PCT polymer or non-reactive. In one embodiment, for instance, the composition contains at least one reactive impact modifier and at least one non-reactive impact modifier.

Reactive impact modifiers that may be used include ethylene-maleic anhydride copolymers, ethylene-alkyl(meth) acrylate-maleic anhydride copolymers, ethylene-alkyl(meth) acrylate-glycidyl(meth)acrylate copolymers, and the like. In one embodiment, for instance, a reactive impact modifier is used that comprises a random terpolymer of ethylene, methylacrylate, and glycidyl methacrylate. The terpolymer can have a glycidyl methacrylate content of from about 5% to about 20%, such as from about 6% to about 10%. The terpolymer may have a methylacrylate content of from about 20% to about 30%, such as about 24%.

Of particular advantage, the present inventors have discovered that the combination of a reactive impact modifier with a reactive viscosity stabilizer may, in some embodiments, further improve the whiteness index of articles made according to the present disclosure after heat aging.

In general, a reactive impact modifier may be present in the composition in an amount from about 0.05% to about 10% by weight, such as in an amount from about 0.1% to about 5% by weight.

Non-reactive impact modifiers that may be blended into the polymer composition of the present disclosure generally include various rubber materials, such as acrylic rubbers, ASA rubbers, diene rubbers, organosiloxane rubbers, EPDM rubbers, SBS or SEBS rubbers, ABS rubbers, NBS rubbers, and the like.

In one embodiment, an ethylene acrylic rubber is present such as an ethylene acrylic ester copolymer. Particular examples of non-reactive impact modifiers include ethylene butylacrylate, ethylene (methyl)acrylate, or 2 ethyl hexyl acrylate copolymers. In one particular embodiment, an ethylene (methyl)acrylate copolymer is present in the composition that contains (methyl)acrylate in an amount of from about 20% to about 30% by weight, such as in an amount of about 24% by weight.

In one particular embodiment, the composition of the present disclosure includes a combination of an ethylene (methyl)acrylate copolymer combined with a terpolymer of ethylene, methylacrylate and glycidyl methacrylate.

When present in the composition, non-reactive impact modifiers can be included in amounts of from about 0.05% to about 15% by weight, such as in an amount from about 0.1% to about 8% by weight.

The polymer composition of the present disclosure may contain various other thermoplastic polymers in addition to the PCT polymer. The other thermoplastic polymers can be present in an amount from about 1% to about 15% by weight. Other thermoplastic polymers that may be included include other polyester polymers, a liquid crystal polymer, or mixtures thereof. Other thermoplastic polyester polymers that may be included in the composition include poly(ethylene terephthalate), poly(propylene terephthalate), poly(butylene terephthalate), acid-modified PCT copolyesters, poly(ethylene naphthalate), poly(butylene naphthalate), aliphatic polyesters such as polyester glutarate, and the like. The inclusion of small amounts of other polyester polymers or a liquid crystal polymer may, in some embodiments, improve the processability of the composition. In one embodiment, for instance, the composition may contain an aromatic liquid crystal polyester polymer in an amount of from about 2% to about 15% by weight.

Another additive that may be present in the polymer composition is a polytetrafluoroethylene polymer. Inclusion of a polytetrafluoroethylene polymer may enhance the reflectance and the whiteness index of articles made from the polymer composition. The polytetrafluoroethylene polymer may be added to the composition in the form of a fine powder having an average particle size of less than about 50 microns, such as less than about 10 microns. In one embodiment, for instance, the polytetrafluoroethylene powder may have an average particle size of from about 1 micron to about 8 microns. The polytetrafluoroethylene polymer may be present in the composition in an amount from about 0.05% to about 10% by weight, such as from about 0.1% to about 6% by weight.

In one embodiment, the polymer composition can also include a lubricant. The lubricant may comprise, for instance, a polyethylene wax, an amide wax, a montanic ester wax, a polyol ester, or the like. A lubricant, in certain embodiments, for instance, may comprise a polyethylene glycol-dilaurate and/or a neopentyl glycol dibenzoate. In one particular embodiment, the lubricant may comprise an oxidized polyethylene wax. The polyethylene wax may have a density of from about 0.94 g/cm$^3$ to about 0.96 g/cm$^3$. When present, the lubricant may be included in the composition in an amount from about 0.05% to about 6% by weight, such as from about 0.1% to about 4% by weight.

In addition to the above, the polymer composition may contain various other additives and ingredients. For instance, the composition may contain various thermal and oxidative stabilizers, ultraviolet light stabilizers, brighteners, and the like. Examples of various other ingredients include sterically hindered phenolic antioxidants, phosphite antioxidants and the like.

In one embodiment, the polymer composition may contain a sterically hindered amine light stabilizer. When present in the composition, hindered amine light stabilizers have been found to provide various advantages and benefits. For instance, sterically hindered amine light stabilizers have been found to further improve the reflectance properties of the material, especially after long term aging. Light stabilizers may be present in the composition in an amount from about 0.05% to about 3% by weight, such as in an amount from about 0.05% to about 1% by weight. In one particular embodiment, a hindered amine light stabilizer may be used in conjunction with a hindered phenolic antioxidant and a phosphite stabilizer.

In order to produce articles in accordance with the present disclosure, the polymer composition, in one embodiment, can comprise a melt-mixed blend, wherein all of the polymeric components are well-dispersed within each other and all of the non-polymeric ingredients are well-dispersed in and bound by the polymer matrix, such that the blend forms a unified whole.

Any melt-mixing method may be used to combine the polymeric components and non-polymeric ingredients. For example, in one embodiment, the polymeric components and the non-polymeric components may be added to a melt mixer, such as for example a single or twin-screw extruder, a blender, a kneader, or a Banbury mixer, either all at once through a single step addition, or in a stepwise fashion and then melt-mixed.

The blended composition can then be molded into any desired shape through any suitable molding process. For instance, in one embodiment, articles are formed through injection molding. During injection molding, the temperature of the composition may be from about 280° C. to about 350° C. The temperature of the molds, on the other hand, may be in a range of from about 80° C. to about 150° C.

In one embodiment, the melt viscosity of the polymer composition when measured by a capillary rheometer at 305° C. under 1000 sec$^{-1}$ shear rate is from about 60 Pa·s to about 250 Pa·s, such as from about 70 Pa·s to about 200 Pa·s. In one embodiment, for instance, the melt viscosity may be from about 80 Pa·s to about 160 Pa·s.

As described above, the PCT polymer composition of the present disclosure is particularly well suited for producing reflectors for LED assemblies. The reflectance properties of the polymer are particularly well suited for use with white LEDs. The LED reflector may be in the form of a single piece or may be formed from two or more subparts. In one embodiment, the polymer composition is injection molded over the lead frame as shown in FIGS. 1 and 2. In this manner, the lead frame and the reflector become integrated together. The semi-conductor light-emitting diode chip can then be mounted within the cavity of the reflector and connected to the lead frame. The LED can be bonded to the lead frame using the bonding wires. The entire assembly can be encased or the cavity defined by the reflector can be filled with a core material such as a solid epoxy that can form a lens for focusing the light in a single direction.

LED assemblies made in accordance with the present disclosure can be used in numerous and different applications. For instance, the LED assemblies can be used in traffic signal lights, LCD displays, backlights, cellular telephones, automotive display lights, automotive headlamps, flashlights, interior lighting, streetlights, and in exterior lighting applications.

The present disclosure may be better understood with reference to the following examples.

EXAMPLES

The following examples are presented below by way of illustration and not by way of limitation.

Table 1 below lists various compositions that were prepared by melt compounding the components shown in the table using a 32 mm twin-extruder operating at 300° C., using a screw speed of about 350 rpm and a melt temperature of from about 320° C. to about 330° C. Upon exiting the extruder, the compositions were cooled and pelletized.

The compositions were molded into ISO tensile bars according to ISO Method 527-1/2 using a mold temperature of about 120° C. Tensile properties of the samples were determined using the test method above. Charpy impact strengths and Notched Charpy impact strengths were determined following ISO Test 179.

Initial reflectance at 460 nm was determined for each composition using ASTM Test Method E1331 using a CIE D65 daylight illuminant at 10° by a spectrocolormeter DataColor 600. Measurements were done on the tensile bars. A higher reflectance number indicates less absorption or loss of light.

The initial whiteness index and the whiteness index after aging were determined using the same reflectance scan based on WI E313. Higher whiteness index numbers indicate better whiteness.

The following results were obtained:

| Composition (wt %) | Example 1 | Example 2 | Example 3 | Example 4 | Example 5 | Example 6 | Example 7 | Example 8 | Example 9 |
|---|---|---|---|---|---|---|---|---|---|
| PCT polymer | 54.5 | 47.4 | 51.9 | 46.9 | 49.9 | 47.9 | 47.8 | 40.8 | 43 |
| Chopped Glass Fiber | 20 | 16 | 16 | 16 | 16 | 16 | 18 | 18 | 16 |
| Titanium Dioxide | 25 | 25 | 20 | 25 | 20 | 20 | 20 | 20 | 20 |
| Oxidized polyethylene wax | | 0.5 | 0.5 | 0.5 | 0.5 | 0.5 | 0.4 | 0.4 | 0.5 |
| Phenolic antioxidant | 0.2 | 0.25 | 0.25 | 0.25 | 0.25 | 0.25 | 0.03 | 0.03 | 0.3 |
| Phosphite stabilizer | 0.3 | 0.3 | 0.3 | 0.3 | 0.3 | 0.3 | 0.03 | 0.03 | |
| Hindered amine light stabilizer | | | | | | | 0.44 | 0.44 | 0.15 |
| Epoxy cresol novolac resin | | 0.5 | | | | | | | |
| Benzoxazole,2,2'-(1,2-ethenediyldi-4,1-phenylene)bis | | 0.05 | 0.05 | 0.05 | 0.05 | 0.05 | 0.1 | 0.1 | 0.05 |
| Ethylene, methyl acrylate, glycidyl methacrylate terpolymer | | 1 | | 1 | | | 0.5 | 0.5 | 0.5 |
| Phenoxy resin | | | 2 | 1 | 2 | 2 | 1 | 1 | 1 |
| Polytetrafluoroethylene powder | | | | | 2 | 4 | 3 | | |
| Ethylene-methylacrylate copolymer | | 3 | 3 | 3 | 3 | 3 | 3 | 3 | 1.5 |
| Talc | | 2 | 2 | 2 | 2 | 2 | 2 | 2 | 2 |
| N,N' ethylene bisstearamide | | | | | | | 0.7 | 0.7 | 1 |
| Polybutylene terephthalate | | 4 | 4 | 4 | 4 | 4 | 3 | 3 | 8 |
| Liquid Crystal Polymer | | | | | | | | 10 | 6 |
| Total (wt %) | 100 | 100 | 100 | 100 | 100 | 100 | 100 | 100 | 100 |
| Properties | | | | | | | | | |
| Tensile Strength (Mpa) | 61 | 73 | 84 | 76 | 83 | 86 | 69 | 86 | 74 |
| Elongation at Break (%) | 0.9 | 1.9 | 1.8 | 1.9 | 1.8 | 1.7 | 2.0 | 1.7 | 1.6 |
| Notched Charpy Impact (KJ/m$^2$) | 2.5 | 4.8 | 3.9 | 4.1 | 3.9 | 3.9 | 3.6 | 3.6 | 3.2 |
| Unnotched Charpy Impact (KJ/m$^2$) | 19 | 38 | 32 | 36 | 34 | 33 | 35 | 25 | 25 |
| R % at 460 nm | 90 | 91 | 96 | 95 | 96 | 97 | 97 | 93 | 92 |
| Initial Whiteness Index | 81 | 84 | 97 | 93 | 96 | 96 | 99 | 90 | 87 |
| Whiteness Index after aging at 200° C. for 4 hr | 37 | 26 | 72 | 78 | 70 | 75 | 62 | 65 | 66 |
| WI Retention after aging (%) | 45.7 | 31.0 | 74.2 | 83.9 | 72.9 | 78.1 | 62.6 | 72.2 | 75.9 |

As shown in the table above, the polymer composition of Example 1 did not contain a reactive viscosity stabilizer. Example No. 2, on the other hand, contained an epoxy cresol novolac resin. In Example 2, the whiteness index after aging was severely reduced.

Compositions made according to the present disclosure, on the other hand, displayed excellent initial reflectance, excellent initial whiteness index and displayed excellent whiteness index properties after aging.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed:

1. A composition for producing molded parts comprising:
   from about 20% to less than 60% by weight of a poly(1,4-cyclohexanedimethanol terephthalate);
   from about 1% to about 40% by weight of an inorganic filler;
   from about 15% to about 50% by weight of a white pigment;
   from about 0.5% to about 8% by weight of one or more reactive viscosity stabilizers, wherein at least one of the reactive viscosity stabilizers comprises a phenoxy resin or a non-aromatic epoxy resin;
   and wherein the composition is free of aromatic epoxy resins and wherein the composition has a spiral flow of greater than 5 inches and wherein the composition has a whiteness index after aging at 200° C. for four hours of greater than 60.

2. A composition as defined in claim 1, wherein the composition comprises a polybutylene terephthalate, a liquid crystal polymer, or mixtures thereof.

3. A composition as defined in claim 1, wherein the composition contains a polytetrafluoroethylene polymer in an amount from about 1% to about 10% by weight.

4. A composition as defined in claim 1, wherein the composition contains an ethylene-(methyl)acrylate copolymer.

5. A composition as defined in claim 1, wherein the composition contains a terpolymer of ethylene, methyl acrylate and glycidyl (meth) acrylate.

6. A composition as defined in claim 4, wherein the composition contains a terpolymer of ethylene, methyl acrylate and glycidyl (meth) acrylate.

7. A composition as defined in claim 1, wherein the reactive viscosity stabilizer comprises an epoxy-functional copolymer comprising a styrene-acrylic copolymer containing glycidyl groups incorporated as side chains.

8. A composition as defined in claim 1, wherein the reactive viscosity stabilizer comprises a phenoxy resin.

9. A composition as defined in claim 1, wherein the poly (1,4-cyclohexanedimethanol terephthalate) is present in an amount from about 20% to about 54.5% by weight.

10. A composition as defined in claim 1, wherein the reactive viscosity stabilizer has reacted with end groups on the poly(1,4-cyclohexanedimethanol terephthalate) polymer.

11. A composition as defined in claim 1, wherein the reactive viscosity stabilizer comprises 3,4-epoxycyclohexenylmethyl-3',4'-epoxycyclohexene carboxylate, 1,4-cyclohexane dimethanoldigrycicdyl ether, hydrogenated bis-phenol-A type epoxy resin and/or tris(2,3-epoxypropyl)isocyanurate, or mixtures thereof.

12. A composition for producing molded parts comprising a polymeric material being comprised of from about 20% to about 60% by weight of a poly(1,4-cyclohexanedimethanol terephthalate), from about 1% to about 40% by weight of an inorganic filler, from about 15% to about 50% by weight of a white pigment, and from about 0.5% to about 8% by weight of at least one reactive viscosity stabilizer, the reactive viscosity stabilizer comprising a phenoxy resin or a non-aromatic epoxy resin, the polymeric material being free of aromatic epoxy resins, the polymeric material having an initial reflectance at 460 nm of greater than about 90%, having an initial whiteness index of greater than about 86, and having a whiteness index after aging at 200° C. for four hours of greater than about 60.

13. A composition as defined in claim 12, wherein the composition contains a terpolymer of ethylene, methyl acrylate and glycidyl (meth) acrylate.

14. A composition as defined in claim 13, wherein the reactive viscosity stabilizer modifier contained within the polymeric material comprises a phenoxy resin.

15. A composition as defined in claim 12, wherein the reactive viscosity stabilizer modifier contained within the polymeric material comprises a phenoxy resin.

16. A composition as defined in claim 12, wherein the reactive viscosity stabilizers are present in the polymeric material in an amount from about 0.2% to about 5% by weight.

17. A composition as defined in claim 12, wherein the polymeric material further contains a reactive impact modifier and a non-reactive impact modifier.

18. A composition as defined in claim 12, wherein the poly(1,4-cyclohexanedimethanol terephthalate) is present in an amount from about 20% to about 54.5% by weight.

19. A composition as defined in claim 12, wherein the reactive viscosity stabilizer has reacted with end groups on the poly(1,4-cyclohexanedimethanol terephthalate) polymer.

20. A composition as defined in claim 12, wherein the reactive viscosity stabilizer comprises 3,4-epoxycyclohexenylmethyl-3',4'-epoxycyclohexene carboxylate, 1,4-cyclohexane dimethanoldigrycicdyl ether, hydrogenated bis-phenol A type epoxy resin and/or tris(2,3-epoxypropyl)isocyanurate, or mixtures thereof.

21. A composition for producing molded parts comprising a polymeric material being comprised of from about 20% to about 54.5% by weight of a poly(1,4-cyclohexanedimethanol terephthalate), from about 1% to about 40% by weight of an organic filler, from about 15% to about 50% by weight of a white pigment, and from about 0.5% to about 8% by weight of at least one reactive viscosity stabilizer, the reactive viscosity stabilizer comprising a phenoxy resin, the polymeric material being free of aromatic epoxy resins; and wherein the composition has a whiteness index after aging at 200° C. for four hours of greater than about 60.

\* \* \* \* \*